United States Patent [19]
Yamashiro et al.

[11] 4,032,864
[45] June 28, 1977

[54] ELECTRONIC CIRCUIT HAVING A MISFET AS AN AMPLIFYING ELEMENT

[75] Inventors: Osamu Yamashiro, Kodaira; Yoshikazu Hatsukano, Hachioji, both of Japan

[73] Assignee: Hitachi, Ltd., Japan

[22] Filed: Feb. 13, 1976

[21] Appl. No.: 658,067

[30] Foreign Application Priority Data

Feb. 28, 1975 Japan .............................. 50-24014

[52] U.S. Cl. ........................... 331/116 R; 58/23 A; 330/35
[51] Int. Cl.² ....................... H03B 5/36; H03F 3/16
[58] Field of Search ................... 331/116 R, 117 R; 58/23 A, 23 AC; 330/35, 40; 307/279, 304

[56] References Cited

UNITED STATES PATENTS

| | | |
|---|---|---|
| 3,889,211 | 6/1975 | Morozumi ..................... 331/116 R |
| 3,935,546 | 1/1976 | Morozumi et al. ............ 331/116 R |

*Primary Examiner*—Siegfried H. Grimm
*Attorney, Agent, or Firm*—Craig & Antonelli

[57] ABSTRACT

In an electronic circuit such as MIS oscillation or amplifier circuit in which a MISFET or MISFET's is used as an amplifying element and a bias resistor is provided between input and output sides, a divided voltage of a power voltage determined by capacitive elements provided at the input side is selected to be equal to a bias voltage determined by the bias resistor, thereby preventing influence due to the variation in power voltage.

4 Claims, 7 Drawing Figures

ELECTRONIC CIRCUIT HAVING A MISFET AS AN AMPLIFYING ELEMENT

The present invention relates to an electronic circuit, and more in particular to an electronic circuit constructed by insulated gate field effect transistor or transistors (hereinafter referred to as MISFET).

A typical type of conventional complementary oscillation circuit for electronic watch comprises a complementary MIS amplifier circuit in which a bias resistor is connected between the input and the output of a complementary inverter circuit including a N channel MISFET and a P channel MISFET. A positive feedback circuit including a quartz oscillator and two capacitors is connected between the input and the output of the amplifier circuit. One of the two capacitors is provided at the input side of the amplifier circuit and the other capacitor is provided at the output side of the amplifier circuit. An oscillation output of the oscillation circuit is coupled to a frequency divider circuit through a waveform shaping circuit. The frequency divider circuit and a gate circuit form a clock pulse signal which in turn is applied to a driving circuit to drive a pulse motor. A battery is commonly provided for the amplifier circuit, the waveform shaping circuit and the motor driving circuit.

In the above-described circuitry, a large driving current flows through the pulse motor so that the battery is exahusted or the power voltage of the battery is greatly decreased at low temperatures because of its high internal resistance. The decrease in power voltage results in an undesirable shift of bias point of the amplifier circuit because of a storage effect of the capacitor which is provided at the input side of the amplifier circuit. As a result, a correct oscillation output cannot be obtained.

Such a problem of shift of bias point due to the variation in power voltage also takes place commonly in MISFET amplifier circuits since parasitic capcitances such as gate capacitance or electrostatic capacitance between electric leads are ncessarily formed at the input side of the amplifier circuit.

An object of the present invention, therefore, is to prevent a shift of bias point due to the variation in power voltage in amplifier circuit constructed by a MISFET or MISFET's.

Another object of the present invention is the stabilization of oscillation output to the variation in power voltage in an oscillation circuit using such a MISFET amplifier circuit.

An electronic circuit comprising a MISFET amplifier circuit, according to the present invention, including a bias resistor between input and output terminals is characterized in that a divided voltage of a power voltage determined by capacitive elements provided at the input side is selected to be equal to a bias voltage determined by the bias resistor.

The above and other objects and features of the present invention will be apparent when reading the following detailed description in conjunction with the accompanying drawings, in which.

Figure 1:
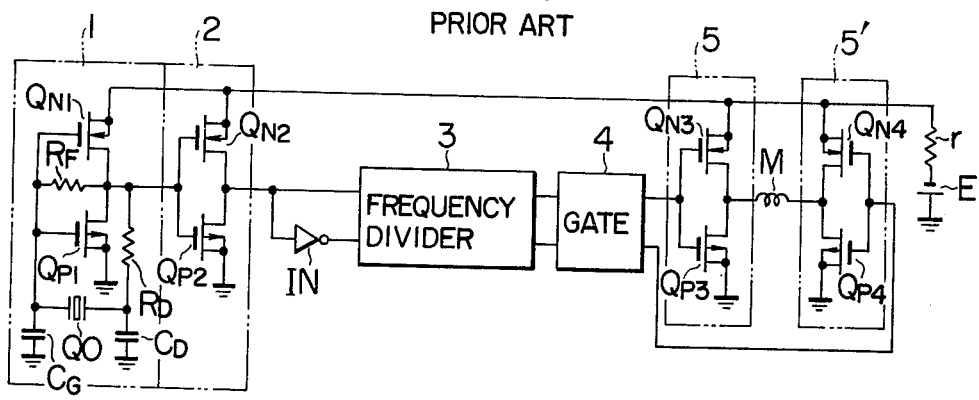
FIG. 1 is a circuit diagram for explaining a conventional complementary MIS circuit for watch.

Prior to the explanation of the present invention, reference will be now made to a conventional complementary MIS circuit for watch, a typical example of which is shown in FIG. 1.

In FIG. 1, an oscillation circuit 1 constituting a main part of the complementary MIS circuit for watch comprises a complementary MIS amplifier circuit in which a bias resistor $R_F$ is connected between the input and output of a complementary inverter circuit including a N channel MISFET $Q_{N1}$ and a P channel MISFET $Q_{P1}$. Between the input and output of the amplifier circuit is provided a positive feedback circuit which includes a quartz oscillator QO and capacitors $C_D$ and $C_G$. A resistor $R_D$ is provided at the output side of the amplifier circuit for limiting an output current to make the power loss small and absorbing the variation in output current due to various factors such as the variation in power voltage.

An oscillation output of the above-constructed oscillation circuit 1 is coupled to a first input of a frequency divider circuit 3 through a complementary inverter circuit 2 which serves as a waveform shaping circuit an includes a N channel MISFET $Q_{N2}$ and a P channel MISFET $Q_{P2}$. The waveform-shaped output from the inverter circuit 2 also in inverted through an inverter IN and then applied to a second input of the frequency divider circuit 3. In cooperation of the frequency divider circuit 3 and a gate circuit 4, signal pulses are generated from two outputs of the gate circuit 4 alternately or one after the other for every second. The pulse signal drives a pulse motor M through a driving circuit 5 which includes a complementary inverter circuit constructed by a N channel MISFET $Q_{N3}$ and a P channel MISFET $Q_{P3}$ and a driving circuit 5' which includes a complementary inverter circuit constructed by a N channel MISFET $Q_{N4}$ and a P channel MISFET $Q_{P4}$.

In the above-described MIS circuit, a large current flows through the pulse motor M when the motor is driven. As a result, a battery E is exhausted or the power voltage of the battery E is greatly decreased at low temperatures because of its high internal resistance r.

Figure 2:
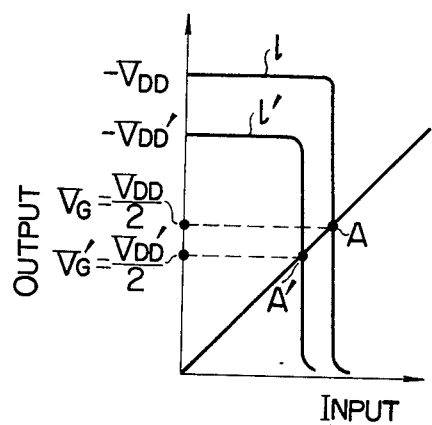
FIG. 2 is an input versus output transfer characteristic graph for expalining a way of determining a bias voltage.

The decrease in power voltage results in the following problems in the oscillation circuit 1. In the amplifier circuit constituting the oscillation circuit 1, a bias point A of the amplifier circuit lies on an input versus output transfer curve $l$ of the amplifier circuit and is defined at a point at which input and output voltages are equal to each other, as shown in FIG. 2. This is due to the fact that the input and output of the amplifier circuit become to the same potential in d.c. wise. In this condition, when the power voltage $-V_{DD}$ abruptly decreases to $-V'_{DD}$ in absolute value, the input versus output characteristic of the amplifier circuit changes in accordance with the variation in power voltage, as represented by a curve $l'$. However, a bias voltage by the bias resistor $R_F$ is maintained at the previous state or a point A because of a storage effect of the capacitor $C_G$ which is provided at the input side of the amplifier circuit. Therefore, the bias voltage is high in absolute value with respect to a new logic threshold level of the amplifier circuit, so that the N channel MISFET $Q_{N1}$ falls near to its cut-off state. Thus, the output level approaches to a ground level with the result that a correct or normal oscillation output is unobtainable. It is of course that the bias voltage is changed to a normal bias point A' on the new input versus output characteristic curve $l'$ after a predetermined time interval determined by the bias resistor $R_F$.

It should be appreciated that the above-described abnormal oscillation output upon the variation in power voltage, for example, when the pulse motor is driven, provide a possibility that time lag may occur in the MIS circuit for watch.

The problem of shift of bais point due to the variation in power voltage also takes place commonly in MISFET amplifier circuits generally constructed by semiconductor integrated circuits, since parasitic capacitances such as gate capacitance or electrostatic capacitance between electric leads are ncessarily formed at the input side of the amplifier circuit.

The above problems can be overcome by the present invention. Preferred embodiments of the present invention will be now explained with respect to FIGS. 3 to 7.

Figure 3:
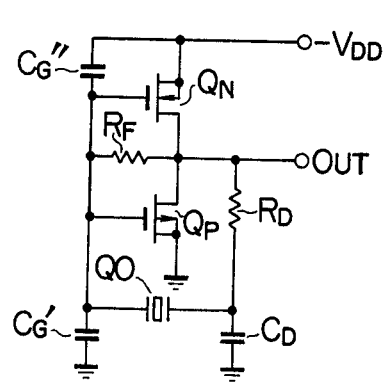
FIG. 3 is a circuit diagram showing an embodiment of complementary MIS oscillation circuit to which the present invention is applied.

In FIG. 3 showing a circuit diagram of an embodiment of complementary MIS oscillation circuit to which the present invention is applied, the oscillation circuit constitutes a complementary MIS amplifier circuit in which a bias resistor $R_F$ is connected between the input and output terminals of an inverter circuit including a N channel MISFET $Q_N$ and a P channel MISFET $Q_P$. A positive feedback circuit including a quartz oscillator QO and capacitors $C_D$ and $C_G$ is connected between the input terminal of the amplifier circuit and one end of a resistor $R_D$ the other end of which is connected to the output terminal OUT of the amplifier circuit. The quartz oscillator is used as an inductive element to form an oscillation circuit. An inductor may be employed instead of the quartz oscillator. In such a complementary MIS oscillation circuit, a capacitor $C_G''$ having substantially the same capacitance as the capacitor $C_G'$ is connected between a power source terminal $-V_{DD}$ and the input terminal. The condition of $C_G'' = C_G'$ is established in order to make a divided voltage of the power voltage determined by the capacitors $C_G''$ and $C_G'$ equal to an input bias voltage which is determined bythe bias resistor $R_F$ and substantially becomes to $-V_{DD}/2$. For a correct oscillation condition, it should be appreciated that each of the capacitances of the capacitors $C_G''$ and $C_G'$ is established to be equal to a half of the capacitance at the input side of the oscillation circuit 1 of FIG. 1, i.e. the capacitor $C_G$.

In the oscillation circuit with the above-described construction according to the present invention, the capacitors provided at the input side of the amplifier circuit form a series circuit between the power source terminal and the ground terminal so that these capacitors exhibit no storage effect with respect to the variation in power voltage and therefore follow this variation. Thus, the bias voltage is not subjected to the influence of the input side capacitors, thereby preventing the occurrrence of abnormal oscillation output.

Figure 4:
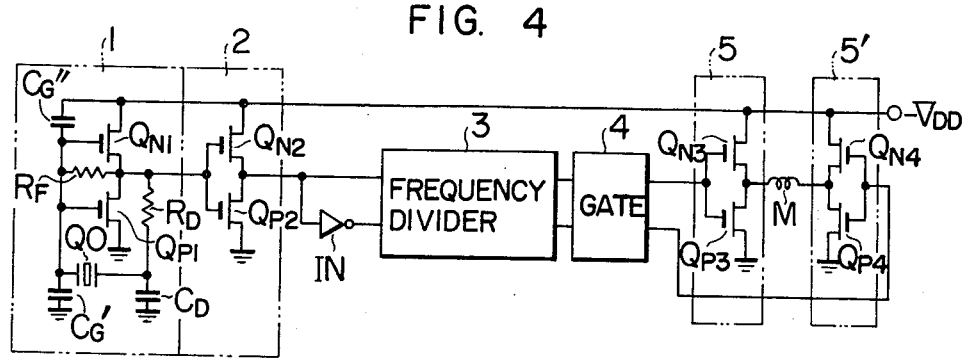
FIG. 4 is a circuit diagram showing an embodiment in which the oscillation circuit of FIG. 3 is applied to a complementary MIS circuit for watch.

FIG. 4 shows an embodiment of complementary MIS circuit for watch to which the oscillation circuit of FIG. 3 is applied. In FIGS. 1, 3 and 4, similar circuit components have similar reference numerals or symbols. A complementary MIS circuit for watch is subjected to the variation in power voltage upon the driving of a pulse motor, as has been explained with respect to FIG. 1. However, the oscillation output of the oscillation circuit 1 of FIG. 4 is not influenced by the variation in power voltage so that a stable oscillation output can be provided to drive the pulse motor M. As a result, the problem such as time lag is eliminated.

Figure 5:
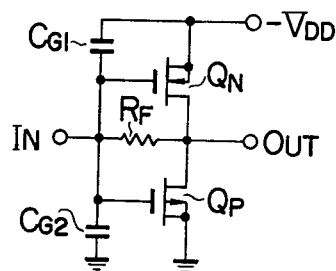
FIG. 5 is a circuit diagram showing an embodiment of complementary MIS amplifier circuit to which the present invention is applied.

FIG. 5 shows an embodiment of complementary MIS amplifier circuit to which the present invention is applied. In the amplifier circuit, capacitors $C_{G1}$ and $C_{G2}$ having substantially the same capacitance are provided at the power source and ground sides respectively. The capacitance $C_{G2}$ at the ground side may be replaced by a parasitic capacitance. In this amplifier circuit, the bais voltage follows the variation in input versus output transfer characteristic resulting from the variation in power voltage, for the same reason as has been described earlier. As a result, the amplification output is stable in a.c. wise.

Figure 6:
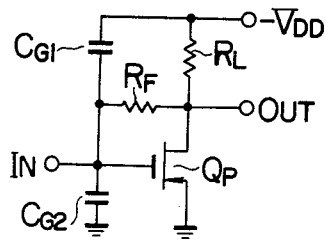
FIG. 6 is a circuit diagram showing an embodiment of another MIS amplifier circuit to which the present invention is applied.
Figure 7:
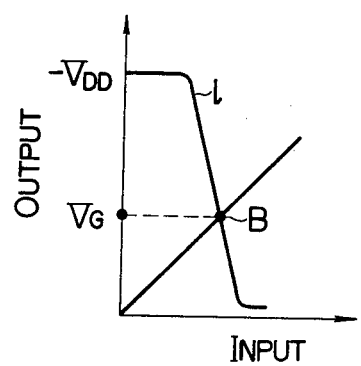
FIG. 7 is an input versus output transfer characteristic graph for explaining a way of determining a bias voltage in the amplifier circuit of FIG. 6.

FIG. 6 shows an embodiment of another MIS amplifier circuit to which the present invention is applied. This MIS amplifier circuit comprises an inverter circuit including a P channel MISFET and a load resistor $R_L$. A resistor $R_F$ is connected between the input terminal IN and output terminal OUT of the inverter circuit. The input versus output transfer characteristic of this MIS amplifier circuit is shown in FIG. 7. As apparent from the figure, the characteristic curve $l$ is different from characteristic curves of complementary MIS amplifier circuit and the bias voltage $V_G$ determined by the bias resistor $R_F$ is not equal to $-V_{DD}/2$. The bias voltage $V_G$ lies on the characteristic curve $l$ and is defined as being at a point at which the input voltage is equal to the output voltage. Therefore, a divided voltage of a power voltage determined by a ratio between the capacitances of the capacitors $C_{G1}$ and $C_{G2}$ selected to be equal to the bais voltage $V_G$.

As has been described, the present invention is widely applicable to complementary MIS oscillation circuits as well as amplifier circuits uits in which a MISFET or MISFET's is used as an amplifying element and a bias resistor is provided between input and output sides.

What is claimed is:
1. An electronic circuit comprising an amplifier circuit including:
   input and output terminals;
   a power voltage terminal;
   a ground terminal;
   at least on insulated gate field effect transistor as an amplifying element, said field effect transistor having its gate, drain and source connected to said input, output and ground terminals respectively;
   a bias resistor provided between said input and output terminals; and
   first and second capacitive elements series-connected between said power voltage terminal and said ground terminal, a divided voltage of a power voltage determined by said first and second capacitive elements being selected to be equal to a bias voltage determined by said bias resistor, said divided voltage being applied to said input terminal.

2. An electronic circuit comprising an oscillation circuit including:

an amplifier circuit having at least one insulated gate field effect transistor as an amplifying element, input and output terminals, and a bias resistor provided between said input and output terminals, said field effect transistor having its gate connected to said input terminal, its drain connected to said output terminal and its source grounded;

positive feedback means for coupling an output signal of said amplifier circuit to the input side thereof, said positive feedback means having an inductive element connected between said input and output terminals, a first capacitive element one end of which is connected to said input terminal and the other end of which is grounded, and a second capacitive element one end of which is connected to said output terminal and the other end of which is grounded; and a third capacitive element connected between a power voltage terminal and said input terminal for dividing a power voltage in cooperation with said first capacitive element, a divided voltage of said power voltage determined by a ratio between the capacitances of said first and third capacitive elements being selected to be equal to a bias voltage determined by said bias resistor.

3. The electronic circuit according to claim 2, wherein the capacitance of said third capacitive element is defined in a manner that the total capacitance of said first and third capacitive elements is equal to a predetermined capacitance of a capacitive element to be provided at said input side of said amplifier circuit to obtain a predetermined oscillating frequency in said oscillation circuit.

4. The electronic circuit according to claim 2, wherein the capacitance of said third capacitive element is defined so as to obtain a predetermined oscillating frequency in said oscillation circuit in cooperation with said first capacitive element.

* * * * *